(12) United States Patent
Shen et al.

(10) Patent No.: US 10,074,698 B2
(45) Date of Patent: Sep. 11, 2018

(54) DISPLAY SUBSTRATE, DISPLAY DEVICE THEREOF, AND MANUFACTURING METHOD THEREFOR

(71) Applicant: BOE Technology Group Co., Ltd., Beijing (CN)

(72) Inventors: Wulin Shen, Beijing (CN); Yanzhao Li, Beijing (CN); Jian Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/503,230

(22) PCT Filed: Jan. 27, 2015

(86) PCT No.: PCT/CN2015/071636
§ 371 (c)(1),
(2) Date: Feb. 10, 2017

(87) PCT Pub. No.: WO2016/065756
PCT Pub. Date: May 6, 2016

(65) Prior Publication Data
US 2017/0236881 A1    Aug. 17, 2017

(30) Foreign Application Priority Data

Oct. 29, 2014    (CN) .......................... 2014 1 0594580

(51) Int. Cl.
*H01L 51/00* (2006.01)
*H01L 27/32* (2006.01)
(Continued)

(52) U.S. Cl.
CPC ........ *H01L 27/3206* (2013.01); *H01L 27/322* (2013.01); *H01L 27/3218* (2013.01);
(Continued)

(58) Field of Classification Search
CPC ............. H01L 51/5265; H01L 51/5256; H01L 27/3218; H01L 27/322
(Continued)

(56) References Cited

U.S. PATENT DOCUMENTS 9,062,852 B2 *   6/2015   Kim .......................... F21V 9/08
2005/0225232 A1 * 10/2005   Boroson ............. H01L 27/3213
                                                    313/504
(Continued)

FOREIGN PATENT DOCUMENTS

CN           1638547 A      7/2005
CN         101661951 A      3/2010
(Continued)

OTHER PUBLICATIONS

Jun. 4, 2015—(WO) International Search Report and Written Opinion Appn PCT/CN2015/071636 with English Tran.
(Continued)

*Primary Examiner* — David Vu
*Assistant Examiner* — Brandon Fox
(74) *Attorney, Agent, or Firm* — Banner & Witcoff, Ltd.

(57) ABSTRACT

A display substrate, an Organic Light Emitting Diode (OLED) display device and a manufacturing method for the display substrate. The display substrate includes a plurality of pixel units located on a substrate and filter functional units corresponding to the pixel units. Each filter functional unit includes at least three micro-cavity structures, wherein the cavity lengths of the three micro-cavity structures in the direction of a vertical substrate are different, only light with a specific wavelength can penetrate through the micro-cavity structures with different cavity lengths, and the cavity lengths of micro-cavity structures corresponding to similar sub-pixel units of the pixel units are the same.

17 Claims, 2 Drawing Sheets

(51) Int. Cl.
*H01L 51/52* (2006.01)
*H01L 51/56* (2006.01)

(52) U.S. Cl.
CPC ...... *H01L 27/3258* (2013.01); *H01L 51/5221* (2013.01); *H01L 51/5256* (2013.01); *H01L 51/5265* (2013.01); *H01L 51/5271* (2013.01); *H01L 51/56* (2013.01); *H01L 2227/323* (2013.01)

(58) Field of Classification Search
USPC .......................................................... 257/40
See application file for complete search history.

(56) References Cited

U.S. PATENT DOCUMENTS

| | | | | |
|---|---|---|---|---|
| 2009/0051283 A1* | 2/2009 | Cok | ................... | H01L 27/3213 313/506 |
| 2009/0251051 A1* | 10/2009 | Hwang | ............... | H01L 27/3213 313/504 |
| 2010/0053043 A1* | 3/2010 | Sakamoto | ........... | H01L 27/3213 345/77 |
| 2014/0191202 A1* | 7/2014 | Shim | ................... | H01L 51/5265 257/40 |

FOREIGN PATENT DOCUMENTS

| | | |
|---|---|---|
| CN | 103441136 A | 12/2013 |
| CN | 104078422 A | 10/2014 |

OTHER PUBLICATIONS

Sep. 26, 2016—(CN) First Office Action Appn 201410594580.1 with English Tran.
May 11, 2017—(CN) Second Office Action Appn 201410594580.1 with English Tran.
Oct. 17, 2017—(CN) Office Action application CN 201410594580.1 with English Translation.

* cited by examiner

DISPLAY SUBSTRATE, DISPLAY DEVICE THEREOF, AND MANUFACTURING METHOD THEREFOR

The application is a U.S. National Phase Entry of International Application No. PCT/CN2015/071636 filed on Jan. 27, 2015, designating the United States of America and claiming priority to Chinese Patent Application No. 201410594580.1 filed on Oct. 29, 2014. The present application claims priority to and the benefit of the above-identified applications and the above-identified applications are incorporated by reference herein in their entirety.

CROSS-REFERENCE TO RELATED APPLICATIONS

The present application claims priority of China Patent application No. 201410594580.1 filed on Oct. 29, 2014, the content of which is incorporated in its entirety as part of the present application by reference herein.

TECHNICAL FIELD

The present disclosure relates to the field of display technology, in particular to an array substrate, a display device, and a manufacturing method.

BACKGROUND

Due to the advantages of simple structure, high-quality dynamic images of organic light-emitting diode (OLED) displays, the OLED displays have gradually stridden forward towards mass production, are favored by more and more flat-panel display manufacturers in the display field, and have become the focus of attention in the display industry.

Currently, the OLED display achieves color pattern display by the structural means of depositing organic color filters (CFs) on an array substrate. However, the method for manufacturing the display by adoption of the organic CFs has the defects of high material cost, multiple manufacturing processes, expensive equipment, difficult fineness, numerous particles, etc.

SUMMARY

The objective of the technical solutions in the present disclosure is to provide an array substrate, a display device, and a manufacturing method, in which it is not necessary to use the organic color film (CF) to fabricate the display, and the problems such as high material cost in the OLED display in the prior art are solved.

The present disclosure provides a display substrate, comprising a plurality of pixel units disposed on a substrate, wherein the display substrate further comprises: each of the pixel units is correspondingly provided with a filter functional unit; the filter functional unit includes at least three microcavity structures; the three microcavity structures being different in cavity length along a direction perpendicular to the substrate; only light with specific wavelength being capable of running through the microcavity structures with different cavity lengths; and the cavity length of the microcavity structures corresponding to subpixel units of a same type in the pixel unit is the same.

Optionally, the display substrate further comprises: a luminous unit configured to emit white light, in which the white light is emitted along a first direction; and a reflecting structure being arranged on an opposite side of a light-emitting side of the luminous unit and allowing light in an opposite direction of the first direction to be reflected towards the first direction.

Optionally, in the above display substrate, the microcavity structures are disposed on the light-emitting side of the luminous unit; the three microcavity structures with different cavity lengths include isolation layers with different thicknesses; an isolated space is disposed between the isolation layers and the luminous unit.

Optionally, the cavity length of each of the microcavity structures is equal to a distance from one surface of the isolation layer close to the luminous unit to the reflecting structure.

Optionally, the cavity length of each of the microcavity structures is adjusted by adjusting a thickness of the isolation layer.

Optionally, the cavity length of each of the microcavity structures corresponds to a wavelength of transmitted light, so that the Fabry-Perot resonance equation can be satisfied.

Optionally, each of the isolation layers includes an Al material layer, a $SiO_x$ material layers or Al material layers and $SiO_x$ material layers alternately arranged. Optionally, the isolation layers in the microcavity structures for different colors of light are formed of sequentially and alternately arranged Al material layers and $SiO_x$ material layers with different layer numbers.

Optionally, in the above display substrate, the luminous unit includes a cathode, an anode and an organic emission functional layer disposed between the cathode and the anode. The emission functional layer includes a hole transportation layer, a light emitting layer and a electron transportation layer.

Optionally, in the above display substrate, the cathode is disposed on one side of the organic emission functional layer away from the microcavity structure compared with the anode; and the cathode is taken as the reflecting structure.

Optionally, in the above display substrate, the display substrate further comprises a thin-film transistors (TFT) configured to drive the luminous unit to emit light; and the TFT includes a gate electrode, an insulating layer, a semiconductor layer, source/drain electrodes and a protective layer which are sequentially arranged along a direction towards the luminous units from the substrate.

Optionally, in the above display substrate, the three microcavity structures with different wavelengths respectively correspond to a blue subpixel unit, a red subpixel unit and a green subpixel unit in the pixel unit.

The present disclosure further provides a display device, comprising any display substrate as mentioned above.

The present disclosure further provides a method for manufacturing a display substrate, comprising: forming a pattern of a filter functional unit on a substrate, wherein the filter functional unit is arranged corresponding to a pixel unit and includes at least three microcavity structures; the microcavity structures being different in cavity length along a direction perpendicular to the substrate; only light with specific wavelength being capable of running through the microcavity structures with different wavelengths; and the cavity length of the microcavity structures corresponding to subpixel units of a same type in the pixel unit is the same.

Optionally, in the above manufacturing method, a pattern of a luminous unit is formed on the basis of forming the pattern of the filter functional unit; the luminous unit is configured to emit white light; and forming the pattern of the luminous unit includes forming an anode, an organic emission functional layer and a cathode in sequence.

Optionally, in the above manufacturing method, the manufacturing method further comprises forming a TFT for driving the luminous unit to emit light on the substrate before forming the pattern of the filter functional unit.

Optionally, in the above manufacturing method, forming the pattern of the filter functional unit includes: forming isolation layers with different thicknesses corresponding to the three microcavity structures with different cavity lengths, in which the isolation layer of the first microcavity structure includes three Al material layers and two $SiO_x$ material layers, and the Al material layers and the $SiO_x$ material layers are alternately arranged; the isolation layer of the second microcavity structure includes two Al material layers and one $SiO_x$ material layer, and the Al material layers and the $SiO_x$ material layer are alternately arranged; and the isolation layer of the third microcavity structure includes one Al material layer.

Optionally, in the above manufacturing method, forming the isolation layers with different thicknesses includes: depositing a structure of the isolation layer corresponding to the first microcavity structure on an area corresponding to the entire filter functional unit; coating photoresist on the formed isolation layer, performing complete ashing on the photoresist corresponding to the third microcavity structure, and performing ashing on the photoresist corresponding to the second microcavity structure by one half in height; etching the Al material layer of the isolation layer corresponding to the third microcavity structure, etching the $SiO_x$ material layer of the isolation layer corresponding to the third microcavity structure, and meanwhile, etching the photoresist corresponding to the second microcavity structure and etching the photoresist corresponding to the first microcavity structure by a portion in thickness; etching the Al material layer of the isolation layer corresponding to the third microcavity structure, and meanwhile, etching the Al material layer of the isolation layer corresponding to the second microcavity structure; etching the $SiO_x$ material layers of the isolation layers corresponding to the third microcavity structure and the second microcavity structure; and stripping off the photoresist on the first microcavity structure.

Optionally, in the above manufacturing method, forming the pattern of the filter functional unit further comprises: depositing a planarization layer after forming the isolation layers.

At least one of the above technical solutions in the embodiments of the present disclosure has the following beneficial effects.

The filter functional unit is manufactured and the corresponding relationship between the cavity length of the microcavity structure of the filter functional unit and the wavelength of light is utilized so that only light with one color can run through one microcavity structure; and white light is converted into colored light, so that RGB color display of the display can be achieved. By adoption of the display substrate provided by the embodiment of the present disclosure, color image display can be achieved without organic CFs, so that not only a high-resolution display can be manufactured but also the processing steps in the manufacturing process of the display can be reduced, and hence the objective of reducing the production cost can be achieved.

DETAILED DESCRIPTION

Figure 1:
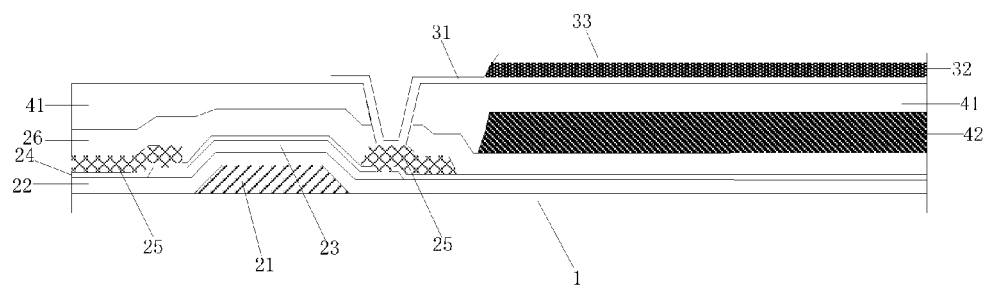
FIG. 1 is a schematic structural view of an array substrate provided by an embodiment of the present disclosure.

For more clear understanding of the objectives, the technical proposals and the advantages of the present disclosure, detailed description will be given below to the present disclosure with reference to the accompanying drawings and the preferred embodiments.

The preferred embodiment of the present disclosure provides a display substrate, which comprises a plurality of pixel units disposed on a substrate, wherein the display substrate further comprises:

filter functional units arranged corresponding to the pixel units; the filter functional unit includes at least three microcavity structures; the cavity length of the microcavity structures along a direction perpendicular to the substrate is different; only light with specific wavelength can run through the microcavity structures with different wavelengths; and the cavity length of the microcavity structures corresponding to subpixel units of the same type in the pixel units is the same.

Specifically, the subpixel units of the same type in the pixel units refer to subpixel units which must display the same color, e.g., blue subpixel units, red subpixel units or green subpixel units.

In the display substrate, the filter functional units are manufactured; the corresponding relationship between the cavity length of the microcavity structure of the filter functional unit and the wavelength of light is utilized so that only light with one color (specific wavelength) can run through one microcavity structure; and white light is converted into colored light, so that RGB color display of the display can be achieved. By adoption of the display substrate provided by the embodiment of the present disclosure, color image display can be achieved without organic CFs, so that not only a high-resolution display can be manufactured but also the processing steps in the manufacturing process of the display can be reduced, and hence the objective of reducing the production cost can be achieved.

The display substrate can be a substrate provided with the filter functional units and is combined into a display device together with an array substrate comprising TFTs. In addition, the display substrate can also be directly formed into the array substrate comprising the TFTs.

The display substrate provided by the present disclosure may be applied in a display device for achieving display by adoption of white light emitted by luminous units as a light source and may also be applied in a display device by adoption of natural light as a light source. When the display substrate is applied to the display device for achieving display by adoption of the white light emitted by the luminous units as the light source, the display substrate further comprises:

luminous units configured to emit the white light, in which the white light is emitted along a first direction; and reflecting structures being arranged on opposite sides of light-emitting sides of the luminous units and allowing light in an opposite direction of the first direction to be reflected towards the first direction.

Specifically, the microcavity structures are disposed on the light-emitting sides of the luminous units; the three microcavity structures with different cavity lengths include isolation layers with different thicknesses; an isolated space is disposed between the isolation layer and the luminous unit; and the cavity length of the microcavity structure is equal to the distance from one surface of the isolation layer close to the luminous unit to the reflecting structure.

FIG. 1 is a schematic structural view of the display substrate provided by the preferred embodiment of the present disclosure. As illustrated in FIG. 1, the display substrate provided by the embodiment of the present disclosure comprises:

a substrate 1;

a gate electrode 21, an insulating layer 22, a semiconductor layer 23, a protective layer 24, a source/drain electrode layer 25 and a protective layer 26 sequentially arranged on the substrate 1 from the bottom up, which layers are superimposed to form thin film transistors (TFTs) of the display substrate;

filter functional units disposed on the TFTs, in which the filter functional units include at least three microcavity structures; and organic light emitting diodes (OLEDs) being disposed on the filter functional units each of which includes an anode 31, an emission functional layer 32 and a cathode 33, in which the structure of the OLEDs is a component of a general OLED display; and it should be understood by those skilled in the art that the emission functional layer 32 may include a hole transport layer (HTL), an emission layer (EML) and an electron transport layer (ETL).

In the display substrate with the structure, the OLEDs are configured to emit white light; the output of the voltage and the current of the OLEDs is controlled by the TFTs formed by the superimposition of the gate electrodes 21, the insulating layer 22, the semiconductor layer 23, the protective layer 24, the source/drain layer 25 and the protective layer 26; and light with at least three wavelengths RGB is formed by transmitted white light via the filter functional units.

Figure 2:
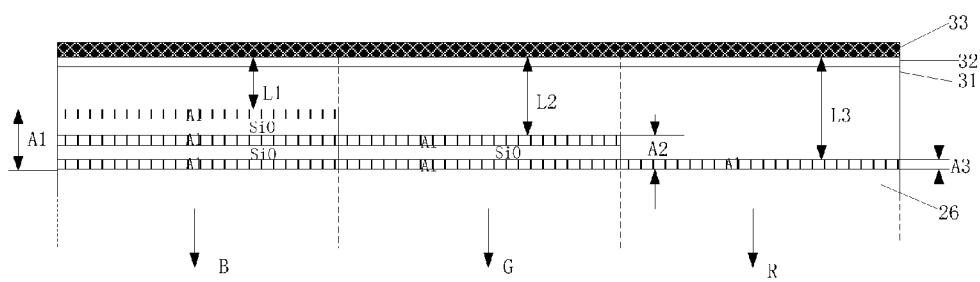
FIG. 2 is a schematic structural view of a filter functional unit.

Moreover, the filter functional unit further includes spatial isolation layers 42. As illustrated in FIG. 2 which is a schematic structural view of the filter functional unit, the spatial isolation layers 42 corresponding to the microcavity structures for forming light of different colors have different thicknesses along the white light emitting direction of the OLEDs. As illustrated in FIG. 2, the thickness of the spatial isolation layer corresponding to the microcavity structure for forming blue light is A1; the thickness of the spatial isolation layer corresponding to the microcavity structure for forming green light is A2; and the thickness of the spatial isolation layer corresponding to the microcavity structure for forming red light is A3, in which A1>A2>A3.

Based on the arrangement of the spatial isolation layers 42, the microcavity length of the microcavity structure is equal to the distance from one surface of the spatial isolation layer away from the substrate 1 to the cathode. As illustrated in FIG. 2, the cavity length of the microcavity structure for forming the blue light is L1; the cavity length of the microcavity structure for forming the green light is L2; and the cavity length of the microcavity structure for forming the red light is L3.

It is well-known by those skilled in the art that the wavelength of the red light is 630 nm-700 nm; the wavelength of the green light is 490 nm-560 nm; and the wavelength of the blue light is 450 nm-490 nm. In the display substrate provided by the present disclosure, the cavity length of the microcavity structure is directly proportional to the wavelength of the formed colored light, namely L3>L2>L1.

Specifically, the corresponding relationship between the cavity length of the microcavity structure and the wavelength of the light satisfies the Fabry-Perot resonance equation.

According to the principle of Fabry-Perot resonant cavities, as for a resonant cavity formed by the opposite arrangement of two parallel glass plates with high reflectivity, when the frequency of incident light in the resonant cavity satisfies the resonance condition of the resonant cavity, a transmission spectrum will have high peak value corresponding to high transmittance, so that only light with corresponding wavelength can run through the resonant cavity with specific characteristic. Moreover, as the cavity length of the resonant cavity affects the transmission characteristic of the light in the cavity, there is corresponding relationship between the cavity length of the Fabry-Perot resonant cavity (corresponding to the microcavity structure in the present disclosure) and the wavelength of the light. When the cavity length of the microcavity structures is different, only light with specific wavelength can run through the microcavity structures with different wavelengths.

The specific formula of the Fabry-Perot resonance equation is:

$$2\Sigma n_i d_i + [\varphi_1 + \varphi_2]*2\pi/\lambda = m\lambda$$

wherein, $n_i$ and $d_i$ respectively represent the refractive index and the thickness of film layers in the cavity; $\Sigma n_i d_i$ represents the total optical thickness of the film layers in the cavity; $\varphi_1$ and $\varphi_2$ represent the reflective phase shift between two reflectors, namely Bragg reflectors, and the cathode; m represents the mode series; and $\lambda$ represents the wavelength.

Therefore, according to the above formula, the cavity length of the microcavity structure is directly proportional to the wavelength of the transmitted light. When the required wavelength of the transmitted light is larger, the cavity length of the microcavity structure is larger.

In the embodiment of the present disclosure, as illustrated in FIG. 2, the cavity length of the microcavity structure may be adjusted according to the thickness of the spatial isolation layer 42 in the filter functional unit. With reference to FIG. 2, the spatial isolation layer 42 of the filter functional unit includes an Al material layer, a $SiO_x$ material layer or Al material layers and $SiO_x$ material layers alternately arranged. The Al material layer has the light reflection function and the etching barrier function in the manufacturing process; by adoption of the Al material layer, light in the microcavity structure is reflected for a plurality of times and has light with certain vibration frequency transmitted; and $SiO_x$ has the function of adjusting the distance between the spaced Al material layers.

Specifically, the spatial isolation layer of the microcavity structure for forming the blue light is provided with an Al material layer, a $SiO_x$ material layer, an Al material layer, a $SiO_x$ material layer and an Al material layer from the top down in sequence; the spatial isolation layer of the microcavity structure for forming the green light is provided with an Al material layer, a $SiO_x$ material layer and an Al material layer from the top down in sequence; and the spatial isolation layer of the microcavity structure for forming the red light is only provided with an Al material layer. That is to say, the blue-light microcavity structure and the green-light microcavity structure are respectively formed by sequentially spaced Al material layers and $SiO_x$ material layers.

By the mutual superimposition of the material layers, the cavity length of the microcavity structure corresponds to the required wavelength of the transmitted light, so that only light with respective wavelength can run through a pixel area corresponding to the microcavity structure.

Moreover, in the embodiment of the present disclosure, the filter functional unit is a portion between the protective layer 26 of the TFT and the cathode 33 of the OLED, wherein the cathode 33 is made from materials with high reflectivity and configured to allow the light emitted by the OLED to be reflected towards the filter functional unit to form the reflecting structure of the display substrate provided by the present disclosure.

In addition, in the manufacturing process of the display substrate with the above structure, in the TFT:

the gate electrode 21 and the source/drain layer 25 may be made from metal such as Cu, Al, Mo, Nd, Ag and Ti or alloy materials of these metals; the insulating layer 22 and the protective layer 24 are made from oxide, nitride or oxynitride of Si; and the semiconductor layer 23 may be made from a-Si, p-Si or oxide semiconductors, in which the oxide semiconductor may be made from single oxide or oxynitride of elements such as In, Ga, Zn, Sn and Tl and may also be made from oxide or oxynitride of any combination of the several elements.

The filter functional units may be manufactured by adoption of half-tone process. Description will be given below to the manufacturing process of the filter functional unit in the display substrate.

Figure 3A:
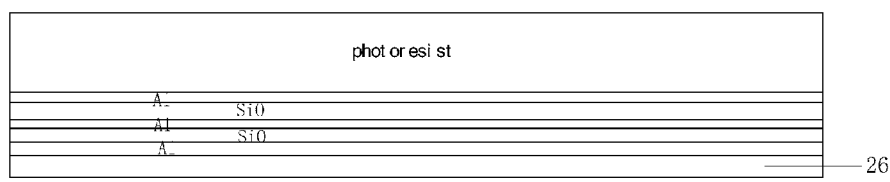
FIGS. 3a to 3e are schematic diagrams of manufacturing processes of spatial isolation layers in the filter functional unit.
Figure 3B:
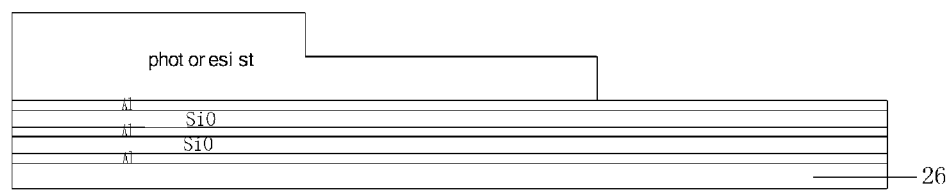
Figure 3C:
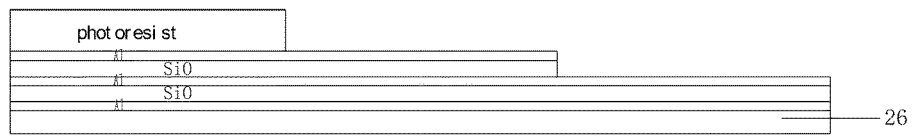

With reference to FIGS. 3a to 3c, the manufacturing process of the filter functional unit includes:

S1: depositing the spatial isolation layer on a pattern of the TFT, and coating photoresist on the spatial isolation layer formed in the first step.

Specifically, as illustrated in FIG. 2, the thickness of the spatial isolation layer corresponding to the microcavity structure for forming the blue light (blue subpixel) is maximum, so materials of the spatial isolation layer corresponding to the microcavity structure for forming the blue light are deposited on the pattern of the TFT. In the embodiment, an Al material layer, a $SiO_x$ material layer, an Al material layer, a $SiO_x$ material layer and an Al material layer are sequentially deposited on the protective layer 26 of the formed TFT.

S2: with reference to FIG. 3b, performing complete ashing on the photoresist corresponding to the red subpixel unit, and performing ashing on the photoresist corresponding to the green subpixel unit by one half in height.

S3: with reference to FIG. 3c, performing wet etching on the Al material layer of the spatial isolation layer corresponding to the red subpixel unit, performing dry etching on the $SiO_x$ material layer of the spatial isolation layer corresponding to the red subpixel unit, etching the photoresist corresponding to the green subpixel unit, and etching the photoresist corresponding to the blue subpixel unit by a portion in thickness.

Figure 3D:
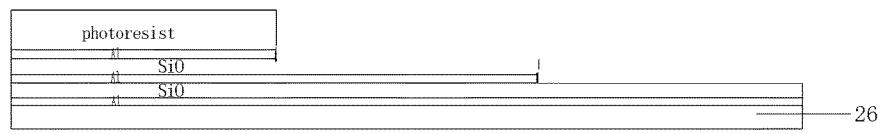

S4: with reference to FIG. 3d, etching the Al material layer of the spatial isolation layer corresponding to the red subpixel unit, and meanwhile, etching the Al material layer of the spatial isolation layer corresponding to the green subpixel unit, in which the step adopts dry etching.

S5: etching the $SiO_x$ material layers of the spatial isolation layers corresponding to the red subpixel unit and the green subpixel unit, in which the step adopts wet etching.

Figure 3E:
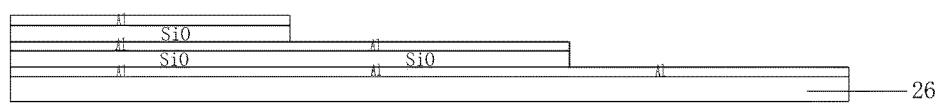

S6: stripping off the photoresist on the blue subpixel unit, and obtaining the structure as illustrated in FIG. 3e.

After the above processing steps, the thickness of the isolation functional layers corresponding to the red subpixel unit, the blue subpixel unit and the green subpixel unit is different from each other, in which the number of superimposed layers in the spatial isolation layer corresponding to the red subpixel unit is minimum and the number of superimposed layers in the spatial isolation layer corresponding to the blue subpixel unit is maximum.

After the above spatial isolation layers are formed, a planarization layer 41 is deposited. As illustrated in FIG. 1, the filter functional unit between the TFT and the OLED is formed.

The manufacturing process of the OLED includes forming an anode 31, an emission functional layer 32 and a cathode 33 on the planarization layer 41 in sequence, in which the anode 31 is made from transparent conductive materials such as indium tin oxide (ITO) and indium zinc oxide (IZO), and the cathode 33 is made from materials with high reflectivity.

In the display substrate with the structure provided by the preferred embodiment of the present disclosure, as the organic CFs are not required by adoption of the microcavity structures with filter function formed on the array substrate to replace the traditional CF structures, color image display may also be achieved; not only a display with higher resolution can be manufactured but also the processing steps can be reduced; and hence the objective of reducing the production cost can be achieved.

In another aspect, the embodiment of the present disclosure provides a manufacturing method of the display substrate with the above structure. The manufacturing method comprises:

forming patterns of filter functional units on a substrate.

The filter functional units are arranged corresponding to the pixel units and respectively include three microcavity structures with different wavelengths; the cavity length of the microcavity structures along a direction perpendicular to the substrate is different; only light with specific wavelength can run through the microcavity structures with different wavelengths; and the cavity length of the microcavity structures corresponding to subpixel units of the same type in the pixel units is the same.

Moreover, the manufacturing method further comprises:

forming patterns of luminous units on the basis of forming the patterns of the filter functional units, in which the luminous units are configured to emit white light; and forming the patterns of the luminous units includes forming anodes, an organic emission functional layer and cathodes in sequence.

The manufacturing method further comprises forming the TFTs for driving the luminous units to emit light on the substrate before forming the patterns of the filter functional units.

Moreover, forming the patterns of the filter functional units includes: forming isolation layers with different thicknesses corresponding to the three microcavity structures with different cavity lengths, in which the isolation layer of the first microcavity structure includes three Al material layers and two $SiO_x$ material layers, and the Al material layers and the $SiO_x$ material layers are alternately arranged; the isolation layer of the second microcavity structure includes two Al material layers and one $SiO_x$ material layer, and the Al material layers and the $SiO_x$ material layer are alternately arranged; and the isolation layer of the third microcavity structure includes one Al material layer.

Optionally, forming the isolation layers with different thicknesses includes:

depositing the structure of the isolation layer corresponding to the first microcavity structure at corresponding area of the entire filter functional unit;

coating photoresist on the formed isolation layer, performing complete ashing on the photoresist corresponding to the third microcavity structure, and performing ashing on the photoresist corresponding to the second microcavity structure by one half in height;

etching the Al material layer of the isolation layer corresponding to the third microcavity structure, etching the $SiO_x$ material layer of the isolation layer corresponding to the third microcavity structure, and meanwhile, etching the photoresist corresponding to the second microcavity structure and etching the photoresist corresponding to the first microcavity structure by a portion in thickness;

etching the Al material layer of the isolation layer corresponding to the third microcavity structure, and meanwhile, etching the Al material layer of the isolation layer corresponding to the second microcavity structure;

etching the $SiO_x$ material layers of the isolation layers corresponding to the third microcavity structure and the second microcavity structure; and stripping off the photoresist on the first microcavity structure.

As illustrated in FIG. 2, in the embodiment of the present disclosure, the spatial isolation layer of the microcavity structure for forming the blue light is provided with an Al material layer, a $SiO_x$ material layer, an Al material layer, a $SiO_x$ material layer and an Al material layer from the top down in sequence; the spatial isolation layer of the microcavity structure for forming the green light is provided with an Al material layer, a $SiO_x$ material layer and an Al material layer from the top down in sequence; and the spatial isolation layer of the microcavity structure for forming the red light is only provided with an Al material layer.

Specifically, as illustrated in FIGS. 3a to 3e, forming the spatial isolation layers on the formed filter functional units includes:

depositing the structure of the spatial isolation layer corresponding to the blue subpixel unit on the pattern of the formed TFT, in which the spatial isolation layer corresponding to the blue subpixel unit includes alternately arranged Al material layers and $SiO_x$ material layers;

coating the photoresist on the spatial isolation layer, performing compete ashing on the photoresist corresponding to the red subpixel unit, and performing ashing on the photoresist corresponding to the green subpixel unit by one half in height;

performing wet etching on the Al material layer of the spatial isolation layer corresponding to the red subpixel unit, performing dry etching on the $SiO_x$ material layer of the spatial isolation layer corresponding to the red subpixel unit, and meanwhile, etching the photoresist corresponding to the green subpixel unit, and etching the photoresist corresponding to the blue subpixel unit by a portion in thickness;

etching the Al material layer of the spatial isolation layer corresponding to the red subpixel unit, and meanwhile, etching the Al material layer of the spatial isolation layer corresponding to the green subpixel unit;

etching the $SiO_x$ material layers of the spatial isolation layers corresponding to the red subpixel unit and the green subpixel unit; and stripping the photoresist on the blue subpixel unit.

Moreover, forming the patterns of filter functional units further includes:

depositing a planarization layer on the basis of forming the spatial isolation layers.

In another aspect, the embodiment of the present disclosure further provides a display device comprising the display substrate with the structure. The display device may be an OLED display device and may also be a liquid crystal display (LCD) device. The structure of the OLED display device or the LCD device provided with the display substrate should be understood by those skilled in the art. No further description will be given here.

It should be understood by those skilled in the art that the display substrate and the display device provided by the embodiment of the present disclosure not only can be applied in the production of RGB pixels but also can be applied in the production of RGBW pixels.

The foregoing is the preferred embodiments of the present disclosure. Various modifications and improvements may also be made by those skilled in the art without departing from the principle of the present disclosure and shall also fall within the scope of protection of the present disclosure.

The invention claimed is:

1. A display substrate, comprising:
a plurality of pixel units disposed on a substrate,
a filter functional unit, wherein each of the pixel units is correspondingly provided with the filter functional unit; the filter functional unit includes at least three microcavity structures; the three microcavity structures are different in cavity length along a direction perpendicular to the substrate; only light with specific wavelength is capable of running through the microcavity structures with different cavity lengths; and the cavity length of the microcavity structures corresponding to subpixel units of a same type in the pixel unit is the same,
a luminous unit configured to emit white light, wherein the white light is emitted along a first direction, and
a reflecting structure being arranged on an opposite side of a light-emitting side of the luminous unit and allowing light in an opposite direction of the first direction to be reflected towards the first direction,
wherein the microcavity structures are disposed on the light-emitting side of the luminous unit; the three microcavity structures with different cavity lengths include isolation layers with different thicknesses; an isolated space is disposed between the isolation layers and the luminous unit; and each of the isolation layers includes Al material layers and $SiO_x$ material layers alternately arranged.

2. The display substrate according to claim 1, wherein the cavity length of each of the microcavity structures is adjusted by adjusting a thickness of the isolation layer.

3. The display substrate according to claim 1, wherein the cavity length of each of the microcavity structures is equal to a distance from one surface of the isolation layer close to the luminous unit to the reflecting structure.

4. The display substrate according to claim 1, wherein the cavity length of each of the microcavity structures corresponds to a wavelength of transmitted light, so that the Fabry-Perot resonance equation can be satisfied.

5. The display substrate according to claim 1, wherein the isolation layers in the microcavity structures for different colors of light are formed of sequentially and alternately arranged Al material layers and SiOx material layers with different layer numbers.

6. The display substrate according to claim 1, wherein the luminous unit includes a cathode, an anode and an organic emission functional layer disposed between the cathode and the anode.

7. The display substrate according to claim 6, wherein the organic emission functional layer includes a hole transportation layer, a light emitting layer and an electron transportation layer.

8. The display substrate according to claim 6, wherein the cathode is disposed on one side of the organic emission functional layer away from the microcavity structure compared with the anode; and the cathode is taken as the reflecting structure.

9. The display substrate according to claim 6, wherein the display substrate further comprises a thin-film transistors (TFT) configured to drive the luminous unit to emit light; and the TFT includes a gate electrode, an insulating layer, a semiconductor layer, source/drain electrodes and a protective layer which are sequentially arranged along a direction towards the luminous units from the substrate.

10. The display substrate according to claim 1, wherein the three microcavity structures with different wavelengths respectively correspond to a blue subpixel unit, a red subpixel unit and a green subpixel unit in the pixel unit.

11. A display device, comprising the display substrate according to claim 1.

12. A method for manufacturing a display substrate, comprising:
    forming a pattern of a filter functional unit on a substrate, wherein
    the filter functional unit is arranged corresponding to a pixel unit and includes at least three microcavity structures; the microcavity structures being different in cavity length along a direction perpendicular to the substrate; only light with specific wavelength is capable of running through the microcavity structures with different wavelengths; and the cavity length of the microcavity structures corresponding to subpixel units of a same type in the pixel unit is the same, and
    forming the pattern of the filter functional unit includes: forming isolation layers with different thicknesses corresponding to the three microcavity structures with different cavity lengths, and each of the isolation layers includes Al material layers and $SiO_x$ material layers alternately arranged.

13. The manufacturing method according to claim 12, wherein a pattern of a luminous unit is formed on a basis of forming the pattern of the filter functional unit; the luminous unit is configured to emit white light; and
    forming the pattern of the luminous unit includes forming an anode, an organic emission functional layer and a cathode in sequence.

14. The manufacturing method according to claim 13, wherein the manufacturing method further comprises forming a TFT for driving the luminous unit to emit light on the substrate before forming the pattern of the filter functional unit.

15. The manufacturing method according to claim 12, wherein the isolation layer of a first microcavity structure, among the three microcavity structures, includes three Al material layers and two $SiO_x$ material layers, and the Al material layers and the $SiO_x$ material layers are alternately arranged; the isolation layer of a second microcavity structure, among the three microcavity structures, includes two Al material layers and one $SiO_x$ material layer, and the Al material layers and the $SiO_x$ material layer are alternately arranged; and the isolation layer of a third microcavity structure, among the three microcavity structures, includes one Al material layer.

16. The manufacturing method according to claim 15, wherein forming the isolation layers with different thicknesses includes:
    depositing a structure of the isolation layer corresponding to the first microcavity structure on an area corresponding to an entirety of the filter functional unit;
    coating photoresist on the formed isolation layer, performing complete ashing on the photoresist corresponding to the third microcavity structure, and performing ashing on the photoresist corresponding to the second microcavity structure by one half in height;
    etching the Al material layer of the isolation layer corresponding to the third microcavity structure, etching the $SiO_x$ material layer of the isolation layer corresponding to the third microcavity structure, and meanwhile, etching the photoresist corresponding to the second microcavity structure and etching the photoresist corresponding to the first microcavity structure by a portion in thickness;
    etching the Al material layer of the isolation layer corresponding to the third microcavity structure, and meanwhile, etching the Al material layer of the isolation layer corresponding to the second microcavity structure;
    etching the $SiO_x$ material layers of the isolation layers corresponding to the third microcavity structure and the second microcavity structure; and
    stripping off the photoresist on the first microcavity structure.

17. The manufacturing method according to claim 15, wherein forming the pattern of the filter functional unit further comprises:
    depositing a planarization layer after forming the isolation layers.

* * * * *